(12) United States Patent
Hall et al.

(10) Patent No.: US 8,716,089 B1
(45) Date of Patent: May 6, 2014

(54) INTEGRATING FORMATION OF A REPLACEMENT GATE TRANSISTOR AND A NON-VOLATILE MEMORY CELL HAVING THIN FILM STORAGE

(71) Applicants: Mark D. Hall, Austin, TX (US); Frank K. Baker, Jr., Austin, TX (US); Mehul D. Shroff, Austin, TX (US)

(72) Inventors: Mark D. Hall, Austin, TX (US); Frank K. Baker, Jr., Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/790,225

(22) Filed: Mar. 8, 2013

(51) Int. Cl.
*H01L 21/8247* (2006.01)

(52) U.S. Cl.
USPC ........... 438/287; 438/257; 438/258; 438/587; 438/588; 257/E21.691

(58) Field of Classification Search
USPC ............ 438/258, 287; 257/E21.472, E21.691
See application file for complete search history.

(56) References Cited

U.S. PATENT DOCUMENTS

| | | | |
|---|---|---|---|
| 5,614,746 A | 3/1997 | Hong et al. | |
| 6,087,225 A | 7/2000 | Bronner et al. | |
| 6,194,301 B1 | 2/2001 | Radens et al. | |
| 6,235,574 B1 | 5/2001 | Tobben et al. | |
| 6,333,223 B1 * | 12/2001 | Moriwaki et al. | 438/241 |
| 6,388,294 B1 | 5/2002 | Radens et al. | |
| 6,509,225 B2 * | 1/2003 | Moriwaki et al. | 438/241 |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,939,767 B2 | 9/2005 | Hoefler et al. | |
| 7,154,779 B2 | 12/2006 | Mokhlesi et al. | |
| 7,202,524 B2 | 4/2007 | Kim et al. | |
| 7,208,793 B2 | 4/2007 | Bhattacharyya | |
| 7,271,050 B2 | 9/2007 | Hill | |
| 7,365,389 B1 | 4/2008 | Jeon et al. | |
| 7,391,075 B2 | 6/2008 | Jeon et al. | |

(Continued)

FOREIGN PATENT DOCUMENTS

WO 2009058486 5/2009

OTHER PUBLICATIONS

U.S. Appl. No. 13/491,771, Hall, M.D., et al., "Integrating Formation of a Replacement Gate Transistor and a Non-Volatile Memory Cell Using a High-K Dielectric", filed Jun. 8, 2012.

(Continued)

*Primary Examiner* — Angel Roman
(74) *Attorney, Agent, or Firm* — James L. Clingan, Jr.; Joanna G. Chiu

(57) ABSTRACT

A thermal oxide is formed in an NVM region and a logic region. A polysilicon layer is formed over the thermal oxide and patterned to form a dummy gate and a select gate in the logic and NVM regions, respectively. A first dielectric layer is formed in the NVM and logic regions which surrounds the select gate and dummy gate. The first dielectric layer is removed from the NVM region and protected in the logic region. A charge storage layer is formed over the select gate. The dummy gate is removed, forming an opening. A second dielectric layer is formed over the select gate and within the opening, and a gate layer is formed over the second dielectric layer and within the opening, wherein the gate layer within the opening forms a logic gate and the gate layer is patterned to form a control gate in the NVM region.

20 Claims, 12 Drawing Sheets

(56) References Cited

U.S. PATENT DOCUMENTS

| | | | |
|---|---|---|---|
| 7,405,968 | B2 | 7/2008 | Mokhlesi et al. |
| 7,439,134 | B1 | 10/2008 | Prinz et al. |
| 7,476,582 | B2 | 1/2009 | Nakagawa et al. |
| 7,544,490 | B2 | 6/2009 | Ferrari et al. |
| 7,544,980 | B2 | 6/2009 | Chindalore et al. |
| 7,544,990 | B2 | 6/2009 | Bhattacharyya |
| 7,560,767 | B2 | 7/2009 | Yasuda et al. |
| 7,795,091 | B2 | 9/2010 | Winstead et al. |
| 7,816,727 | B2 | 10/2010 | Lai et al. |
| 7,906,396 | B1 | 3/2011 | Chiang et al. |
| 7,989,871 | B2 | 8/2011 | Yasuda |
| 7,999,304 | B2 | 8/2011 | Ozawa et al. |
| 8,063,434 | B1 | 11/2011 | Polishchuk et al. |
| 8,138,037 | B2 | 3/2012 | Chudzik et al. |
| 8,168,493 | B2 | 5/2012 | Kim |
| 8,298,885 | B2 * | 10/2012 | Wei et al. .................. 438/190 |
| 8,334,198 | B2 | 12/2012 | Chen et al. |
| 8,372,699 | B2 | 2/2013 | Kang et al. |
| 8,389,365 | B2 | 3/2013 | Shroff et al. |
| 8,399,310 | B2 | 3/2013 | Shroff et al. |
| 8,524,557 | B1 | 9/2013 | Hall et al. |
| 8,536,006 | B2 | 9/2013 | Shroff et al. |
| 8,536,007 | B2 | 9/2013 | Shroff et al. |
| 2002/0061616 | A1 | 5/2002 | Kim et al. |
| 2004/0075133 | A1 | 4/2004 | Nakagawa et al. |
| 2006/0046449 | A1 | 3/2006 | Liaw |
| 2007/0077705 | A1 | 4/2007 | Prinz et al. |
| 2007/0215917 | A1 | 9/2007 | Taniguchi |
| 2007/0224772 | A1 | 9/2007 | Hall et al. |
| 2007/0249129 | A1 | 10/2007 | Hall et al. |
| 2007/0264776 | A1 | 11/2007 | Dong et al. |
| 2008/0050875 | A1 | 2/2008 | Moon et al. |
| 2008/0121983 | A1 | 5/2008 | Seong et al. |
| 2008/0145985 | A1 | 6/2008 | Chi |
| 2008/0185635 | A1 | 8/2008 | Yanagi et al. |
| 2008/0237700 | A1 | 10/2008 | Kim et al. |
| 2008/0290385 | A1 | 11/2008 | Urushido |
| 2008/0308876 | A1 | 12/2008 | Lee et al. |
| 2009/0065845 | A1 | 3/2009 | Kim et al. |
| 2009/0072274 | A1 | 3/2009 | Knoefler et al. |
| 2009/0078986 | A1 | 3/2009 | Bach |
| 2009/0101961 | A1 | 4/2009 | He et al. |
| 2009/0111229 | A1 | 4/2009 | Steimle et al. |
| 2009/0179283 | A1 | 7/2009 | Adams et al. |
| 2009/0225602 | A1 | 9/2009 | Sandhu et al. |
| 2009/0256211 | A1 | 10/2009 | Booth, Jr. et al. |
| 2009/0273013 | A1 * | 11/2009 | Winstead et al. .............. 257/315 |
| 2009/0278187 | A1 | 11/2009 | Toba |
| 2011/0031548 | A1 | 2/2011 | White et al. |
| 2011/0095348 | A1 | 4/2011 | Chakihara et al. |
| 2011/0204450 | A1 | 8/2011 | Moriya |
| 2012/0104483 | A1 | 5/2012 | Shroff et al. |
| 2012/0132978 | A1 | 5/2012 | Toba et al. |
| 2012/0248523 | A1 | 10/2012 | Shroff et al. |
| 2012/0252171 | A1 | 10/2012 | Shroff et al. |
| 2013/0026553 | A1 | 1/2013 | Horch |
| 2013/0037886 | A1 | 2/2013 | Tsai et al. |
| 2013/0065366 | A1 | 3/2013 | Thomas et al. |
| 2013/0171785 | A1 | 7/2013 | Shroff et al. |
| 2013/0171786 | A1 | 7/2013 | Shroff et al. |
| 2013/0178027 | A1 | 7/2013 | Hall et al. |
| 2013/0178054 | A1 | 7/2013 | Shroff et al. |
| 2013/0264633 | A1 | 10/2013 | Hall et al. |
| 2013/0264634 | A1 | 10/2013 | Hall et al. |
| 2013/0267074 | A1 | 10/2013 | Hall et al. |

OTHER PUBLICATIONS

U.S. Appl. No. 13/343,331, Shroff, M., et al., "Non-Volatile Memory (NVM) and Logic Integration", filed Jan. 4, 2012.
U.S. Appl. No. 13/441,426, Shroff, M., et al., "Non-Volatile Memory (NVM) and Logic Integration", filed Apr. 6, 2012.
U.S. Appl. No. 13/780,574, Hall, M.D., et al., "Non-Volatile Memory (NVM) and Logic Integration", filed Feb. 28, 2013.
U.S. Appl. No. 13/780,591, Shroff, M., et al., "Non-Volatile Memory (NVM) and Logic Integration", filed Feb. 28, 2013.
Chen, J.H., et al., "Nonvolatile Flash Memory Device Using Ge Nanocrystals Embedded in HfAlO High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO-SiO2 tunnel layer", Sciencedirect. com, Solid-State Electronics, vol. 61, Issue 1, Jul. 2011, pp. 100-105, http://wwww.sciencedirect.com/science/article/pii/ S0038110111000803.
Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1 - 28.1. 4, pp. 634-637.
Lee, J.J., et al., "Theoretical and Experimental Investigation of Si Nanocrystal Memory Device with H102 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.
Mao, P., et al., "Nonvolatile memory devices with high density ruthenium nanocrystals", Applied Physics Letters, vol. 93, Issue 24, Electronic Transport and Semiconductors, 2006.
Mao, P., et al., "Nonvolatile Memory Characteristics with Embedded high Density Ruthenium Nanocrystals", http://iopscience.iop.org/ 0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X. P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Hall, M.D., et al., "Non-Volatile Memory Cell and Logic Transistor Integration", Office Action—Allowance—May 3, 2013.
U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.
U.S. Appl. No. 13/491,771, Hall et al , "Integrating Formation of a Replacement Ggate Transistor and A Non-Volatile Memory Cell Using a High-K Dielectric", Office Action—Rejection, Sep. 9, 2013.
U.S. Appl. No. 13/442,142, Hall, M.D., et al., "Logic Transistor and Non-Volatile Memory Cell Integration", Office Action—Ex Parte Quayle, Apr. 4, 2013.
U.S. Appl. No. 13/442,142, Hall, M.D., et al., "Logic Transistor and Non-Volatile Memory Cell Integration", Office Action—Allowance, Aug. 2, 2013.
U.S. Appl. No. 13/907,491, Hall, M.D., et al., "Logic Transistor and Non-Volatile Memory Cell Integration", Office Action—Rejection, Sep. 3, 2013.
U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and non-Volatile Memory Cells", Office Action—Rejection, Aug. 22, 2013.
U.S. Appl. No. 13/077,491, Shroff, M., et al., "Non-Volatile Memory and Logic Circuit Process Integration", Office Action—Rejection, Aug. 15, 2012.
U.S. Appl. No. 13/077,491, Shroff, M., et al., "Non-Volatile Memory and Logic Circuit Process Integration", Office Action—Rejection, Feb. 6, 2013.

(56) References Cited

OTHER PUBLICATIONS

U.S. Appl. No. 13/077,491, Shroff, M., et al., "Non-Volatile Memory and Logic Circuit Process Integration", Office Action—Allowance, Jun. 18, 2013.
U.S. Appl. No. 13/077,501, Shroff, M., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/491,760, Shroff, M., et al., "Integrating Formation of a Replacement Gate Transistor and a Non-Volatile Memory Cell Using an Interlayer Dielectric", Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/781,727, Shroff, M., et al., "Methods of Making Logic Transistors and non-Volatile Memory Cells", Office Action—Restriction, Jun. 21, 2013.
U.S. Appl. No. 13/790,014, Hall, M., et al., "Integrating Formation of a Logic Transistor and a non-Volatile Memory Cell Using a Partial Replacement Gate Technique", filed Mar. 8, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", file Oct. 26, 2012.
U.S. Appl. No. 13/780,591, Hall, M.D., et al., "Non-Volatile Memory (NVM) and Logic Integration", Office Action—Allowance mailed Nov. 22, 2013.
U.S. Appl. No. 13/790,014, Hall, M.D., et al., "Integrating Formation of a Logic Transistor and a Non-Volatile Memory Cell Using a Partial Replacement Gate Technique", Office Action—Allowance mailed Dec. 24, 2013.
U.S. Appl. No. 13/780,574, Hall, M.D., et al., "Non-Volatile Memory (NVM) and Logic Integration", Office Action—Allowance mailed Dec. 24, 2013.
U.S. Appl. No. 13/442,142, Hall, M.D., et al., "Logic Transistor and Non-Volatile Memory Cell Integration", Office Action—Allowance mailed Dec. 31, 2013.
U.S. Appl. No. 13/491,771, Hall et al, "Integrating Formation of a Replacement Ggate Transistor and a Non-Volatile Memory Cell Using a High-K Dielectric", Office Action—Allowance, Jan. 16, 2014.
Office Action mailed Jan. 31, 2014 in U.S. Appl. No. 13/781,727.
U.S. Appl. No. 13/441,426, Shroff, M., et al., "Non-Volatile Memory (NVM) and Logic Integration", Office Action—Allowance, Feb. 21, 2014.
U.S. Appl. No. 13/442,142, Hall, M.D., et al., "Logic Transistor and Non-Volatile Memory Cell Integration", Office Action—Allowance, Feb. 28, 2014.
U.S. Appl. No. 13/790,014, Hall, M., et al., "Integrating Formation of a Logic Transistor and a Non-Volatile Memory Cell Using a Partial Replacement Gate Technique", Office Action—Allowance, mailed Mar. 3, 2014.
U.S. Appl. No. 13/491,771, Hall et al., "Integrating Formation of a Replacement Gate Transistor and a Non-Volatile Memory Cell Using a High-K Dielectric", Office Action—Allowance, mailed Mar. 6, 2014.
U.S. Appl. No. 13/907,491, Hall et al., "Logic Transistor and Non-Volatile Memory Cell Integration", Office Action—Allowance, mailed Mar. 11, 2014.

* cited by examiner

INTEGRATING FORMATION OF A REPLACEMENT GATE TRANSISTOR AND A NON-VOLATILE MEMORY CELL HAVING THIN FILM STORAGE

CROSS-REFERENCE TO RELATED APPLICATION(S)

This application is related to U.S. patent application Ser. No. 13/790,014, filed on even date, titled "INTEGRATING FORMATION OF A LOGIC TRANSISTOR AND A NON-VOLATILE MEMORY CELL USING A PARTIAL REPLACEMENT GATE TECHNIQUE," naming Mark D. Hall, Mehul D. Shroff, and Frank K. Baker as inventors, and assigned to the current assignee hereof.

BACKGROUND

1. Field

This disclosure relates generally to integrating formation of a replacement gate and a non-volatile memory cell, and more specifically, to integrating formation of a replacement gate and a non-volatile memory cell where the non-volatile memory cell uses a thin film storage such as nanocrystals or nitride.

2. Related Art

Non-volatile memories (NVMs) are often on an integrated circuit which also performs other functions. In such cases it is undesirable to sacrifice logic performance in favor of performance of the NVM. Also it is important to avoid or minimize additional cost in achieving high performance for both the logic and the NVM. Replacement gate, which is a technique for enhancing performance by using a dummy gate for the formation of source/drains and then replacing the dummy gate with a higher performance gate such as one with higher conductance and an optimized work function, has shown promise. Replacement gate is particularly helpful in achieving both metal gate and using a high-k dielectric for the gate dielectric.

Accordingly there is a need to provide further improvement in achieving high performance while also addressing cost increase issues in integrated circuits that have both NVM and logic.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration technique makes a replacement gate transistor in a logic region and a non-volatile memory (NVM) cell in a memory region in which the select gate of the NVM cell is made of polysilicon and the control gate of the NVM cell is made contemporaneously with the replacement gate of the replacement gate transistor. This is better understood by reference to the drawings and the following written description.

In one aspect, an integration technique makes a logic transistor in a logic region and a non-volatile memory (NVM) cell in a memory region in which the select gate of the NVM cell is made of polysilicon and the control gate of the NVM cell is made contemporaneously with a logic gate using a partial replacement gate technique. This is better understood by reference to the drawings and the following written description.

The semiconductor substrate described herein can be any semiconductor material or combinations of material that has a surface semiconductor material that may be oxidized to form a gate dielectric.

Figure 1:
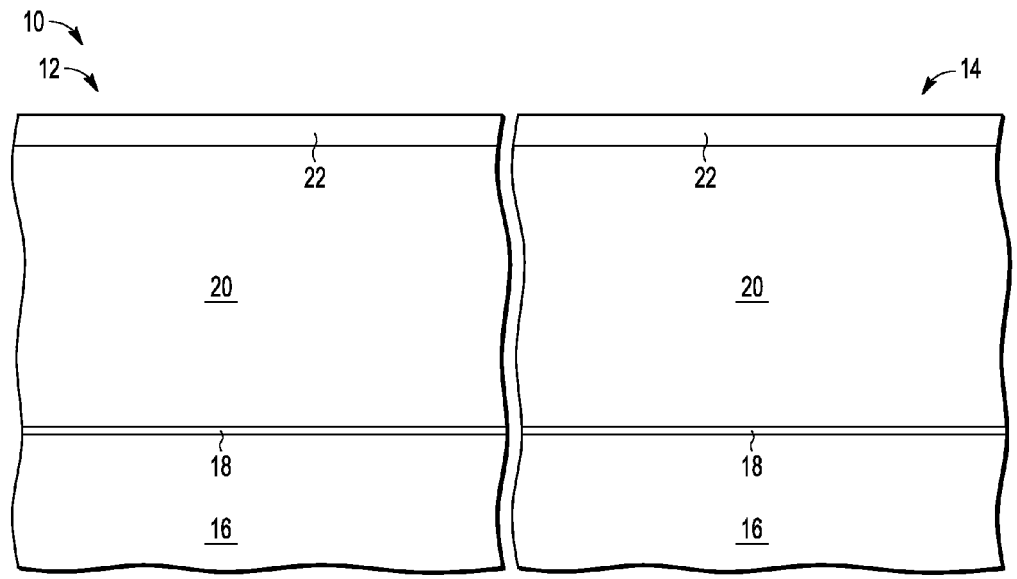
FIG. 1 is a cross section of a non-volatile memory cell and a replacement gate transistor at a stage in processing according to a first embodiment.

Shown in FIG. 1 is a semiconductor device 10 having a non-volatile memory (NVM) portion 12 and a logic portion 14 formed over a semiconductor substrate 16 of silicon. Over substrate 16 in both the NVM and logic portions 12 and 14 is a dielectric layer 18 that is a thermally grown oxide useful as a gate dielectric for an NVM cell. A polysilicon layer 20 is formed over dielectric layer 18. A hard mask layer 22 is formed over polysilicon layer 20. Hard mask layer 22 may be nitride. Dielectric layer 18 in logic portion 14 will be replaced with a gate dielectric for a logic transistor in subsequent processing.

Figure 2:
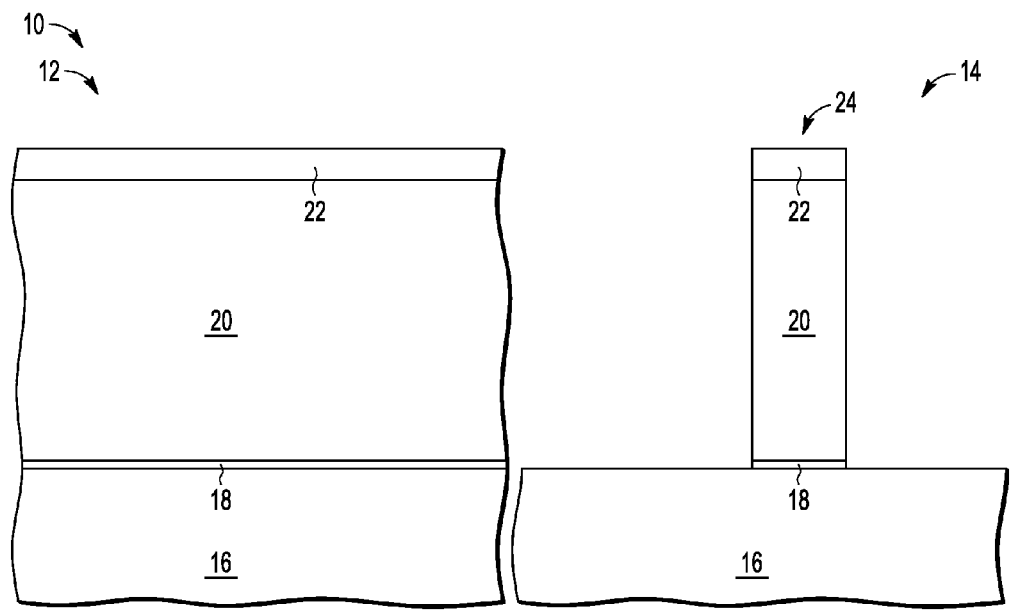
FIG. 2 is a cross section of a non-volatile memory cell and a replacement gate transistor of FIG. 1 at a subsequent stage in processing.

Shown in FIG. 2 is semiconductor device 10 after etching polysilicon layer 20 into a dummy gate 24 in logic portion 14. NVM portion 12 is masked during the formation of dummy gate 24. Hard mask 22 is useful in providing protection for NVM portion 12 while etching through polysilicon layer 20 in logic portion 14. Dummy gate 24 will be replaced by a logic gate in subsequent processing.

Figure 3:
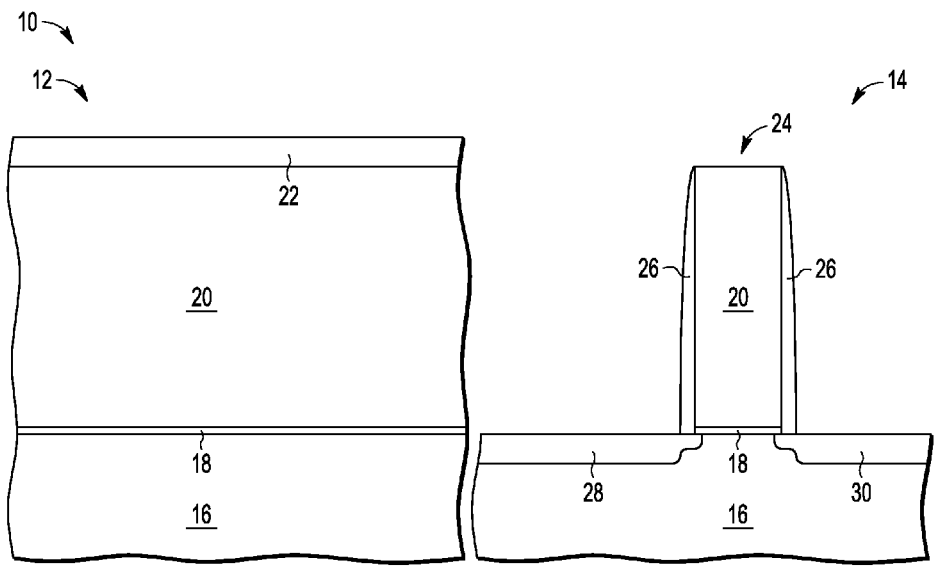
FIG. 3 is a cross section of a non-volatile memory cell and a replacement gate transistor of FIG. 2 at a subsequent stage in processing.

Shown in FIG. 3 is semiconductor device 10 after forming, in logic portion 14, a sidewall spacer 26 around dummy gate 24, a source/drain region 28 in substrate 16 on a first side of dummy gate 24, and a source/drain region 30 on a second side of dummy gate 24. Sidewall spacer 26 formation may be preceded by a liner on the sides of dummy gate 24, which is not separately shown, that may be oxide. The portion of hard mask 22 over dummy gate 24 may be removed during this sequence of steps, and is shown as being removed in FIG. 3, or subsequently during a chemical mechanical polishing (CMP) step as part of FIG. 5 below. Another possibility is for the hard mask to be left intact and removed later in the sequence during the replacement gate process.

Figure 4:
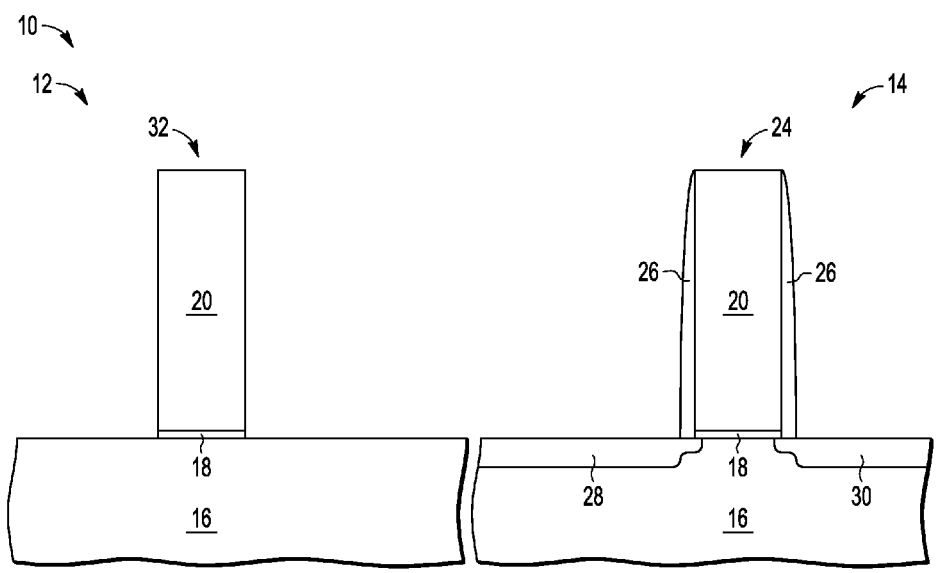
FIG. 4 is a cross section of a non-volatile memory cell and a replacement gate transistor of FIG. 3 at a subsequent stage in processing.

Shown in FIG. 4 is semiconductor device 10 after pattern etching polysilicon layer 20 to form a select gate 32. Two sides of select gate 32 are shown in FIG. 4. This etch results in select gate 32 running in a word line direction of an NVM array having a plurality of NVM cells of which one NVM cell will be finished in subsequent processing in NVM portion 12.

Figure 5:
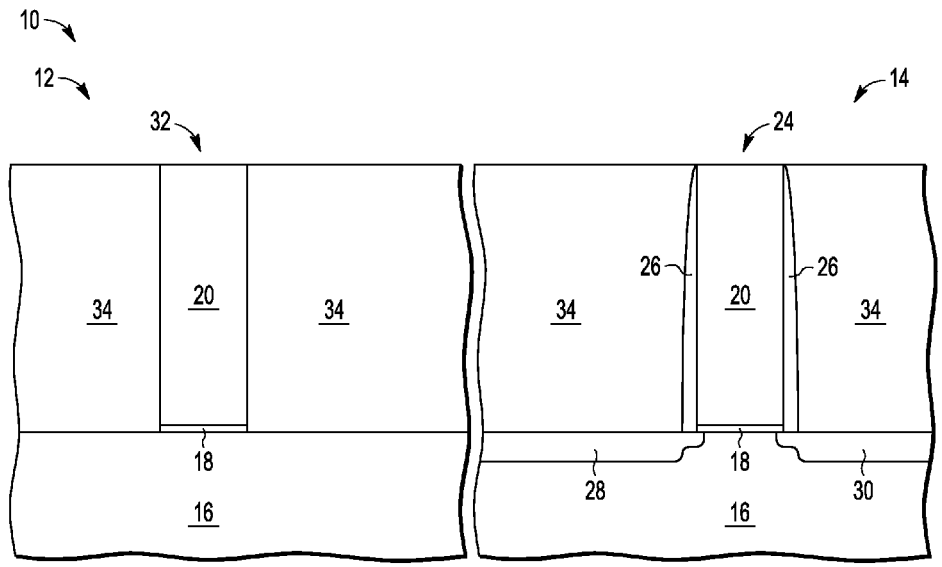
FIG. 5 is a cross section of a non-volatile memory cell and a replacement gate transistor of FIG. 4 at a subsequent stage in processing.

Shown in FIG. 5 is semiconductor device 10 after forming an interlayer dielectric (ILD) 34 on the sides of select gate 32 in NVM portion 12 and around sidewall spacer 26 and thus around dummy gate 24 in logic portion 14. ILD 34 has a top surface coplanar with a top surface of select gate 32 and a top surface of dummy gate 24. This may be achieved using the well-understood technique of deposition followed by chemical mechanical polishing.

Figure 6:
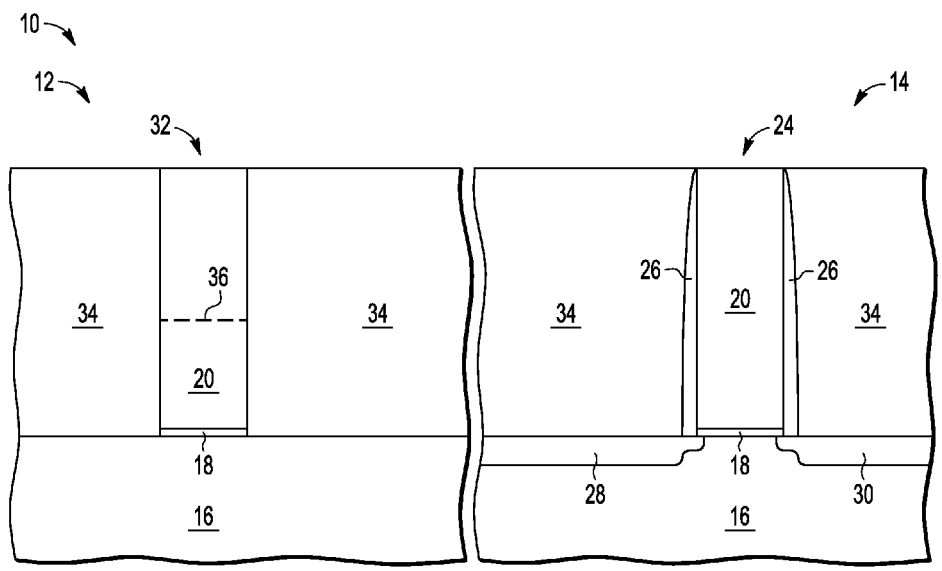
FIG. 6 is a cross section of a non-volatile memory cell and a replacement gate transistor of FIG. 5 at a subsequent stage in processing.

Shown in FIG. 6 is semiconductor device 10 with a line 36 across select gate 32 where, as an alternative, an etch-back of select gate 32 may occur while logic portion 14 is protected. Polysilicon can be etched selectively to oxide so no mask is required on NVM portion 12 to achieve the etch-back of just select gate 32 in NVM portion 12 if that alternative is chosen. The etch-back would leave an alternate top surface at line 36 for the select gate in FIG. 6. As a further alternative approach for forming the select gate to top surface 36 as shown in FIG. 6, the deposition of select gate 32 in FIG. 1 could be replaced by an initial polysilicon deposition of the desired height followed by an etch stop layer and a fill material over the etch stop layer. The fill material could be polysilicon and the etch stop layer could be nitride. FIGS. 7-12 show subsequent processing with select gate 32 at its full height of FIG. 5 and FIG. 13 shows the result of etch-back processing applied instead to the select gate having its top surface at line 36.

Figure 7:
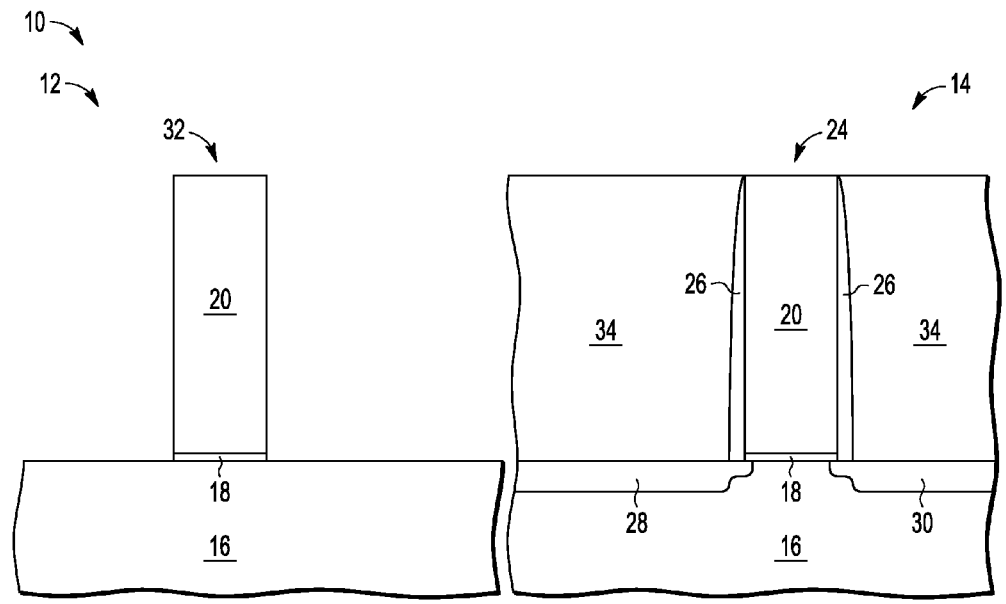
FIG. 7 is a cross section of a non-volatile memory cell and a replacement gate transistor of FIG. 6 at a subsequent stage in processing.

Shown in FIG. 7 is semiconductor device 10 after removing ILD 34 in NVM portion 12 showing select gate 32. This shows two sides of select gate 32 that run in the word line direction and are exposed. Logic portion 14 is masked and an etchant that removes oxide and that is selective to polysilicon is applied without requiring a mask over NVM portion 12. A mask may be required over logic portion 14 to protect dummy gate 24.

Figure 8:
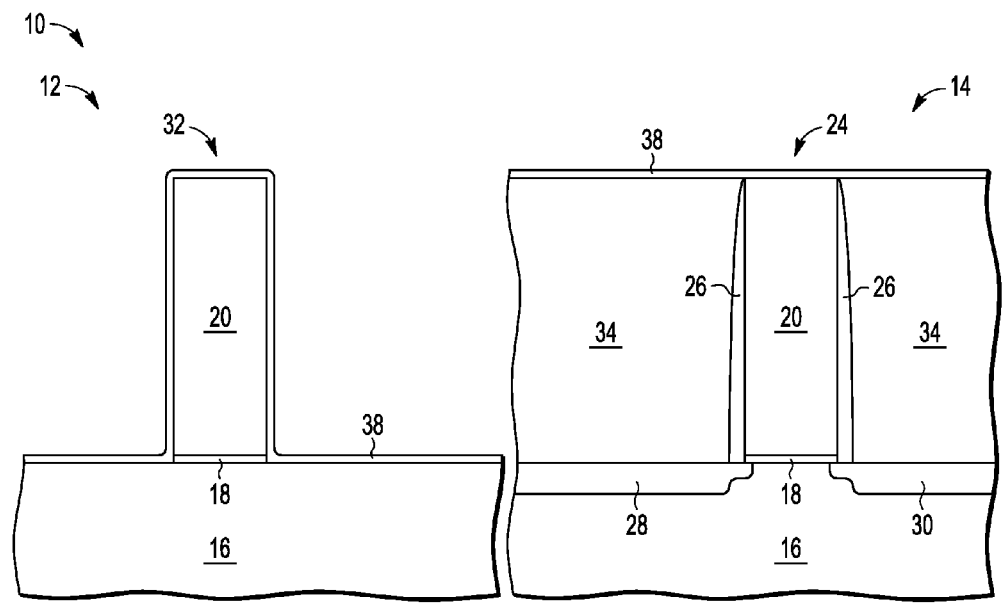
FIG. 8 is a cross section of a non-volatile memory cell and a replacement gate transistor of FIG. 7 at a subsequent stage in processing.

Shown in FIG. 8 is semiconductor device 10 after depositing a charge storage layer 38 on the top and two sides of select gate 32 of NVM portion 12 and on ILD 34 and dummy gate 24 of logic portion 14. Charge storage layer 38 is chosen to be combined with a high-k dielectric layer to be formed as the gate dielectric for the logic transistor to be completed in logic portion 14. For example, charge storage layer 38 may comprise a dielectric layer on substrate 16, nanocrystals on the dielectric layer, and a fill dielectric that is a thickness that is above the nanocrystals that takes into account that there will be a subsequently formed high-k dielectric layer formed over the nanocrystals. In such a case, the different thicknesses of the components of the charge storage layer will be chosen so that, when combined with the high-k dielectric, the operation will be optimized taking into account, for example, breakdown voltage, leakage, and capacitance. The high-k dielectric layer, as may be the case with high-k dielectric layers in general, may be a stack of dielectric layers that may include a layer, such as silicon oxide, that is not considered high-k.

Figure 9:
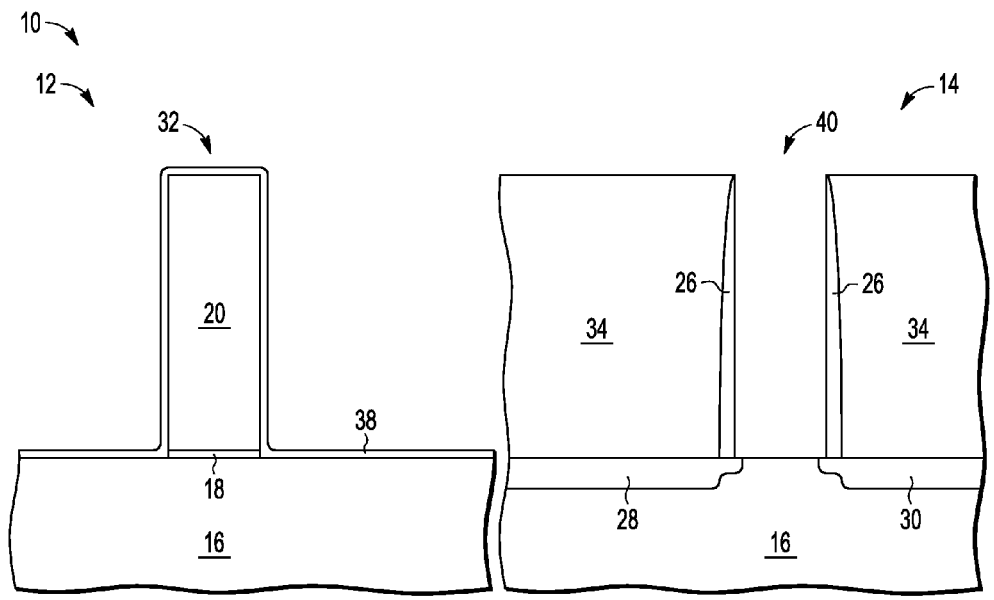
FIG. 9 is a cross section of a non-volatile memory cell and a replacement gate transistor of FIG. 8 at a subsequent stage in processing.

Shown in FIG. 9 is semiconductor device 10 after removing dummy gate 24 and underlying dielectric 18 to leave an opening 40 in logic portion 14 surrounded by sidewall spacer 26. Charge storage layer 38 is also removed in logic portion 14. This exposes the substrate 16 at the bottom of opening 40. NVM portion 12 is masked during this removal of dummy gate 24. No mask is required on logic portion 14 because an etchant that etches dummy gate 24 can be found that is selective to ILD 34. Dielectric 18 is very thin compared to ILD 34 so the effect of removing dielectric 18 without a mask on logic portion 14 has minimal effect on ILD 34.

Figure 10:
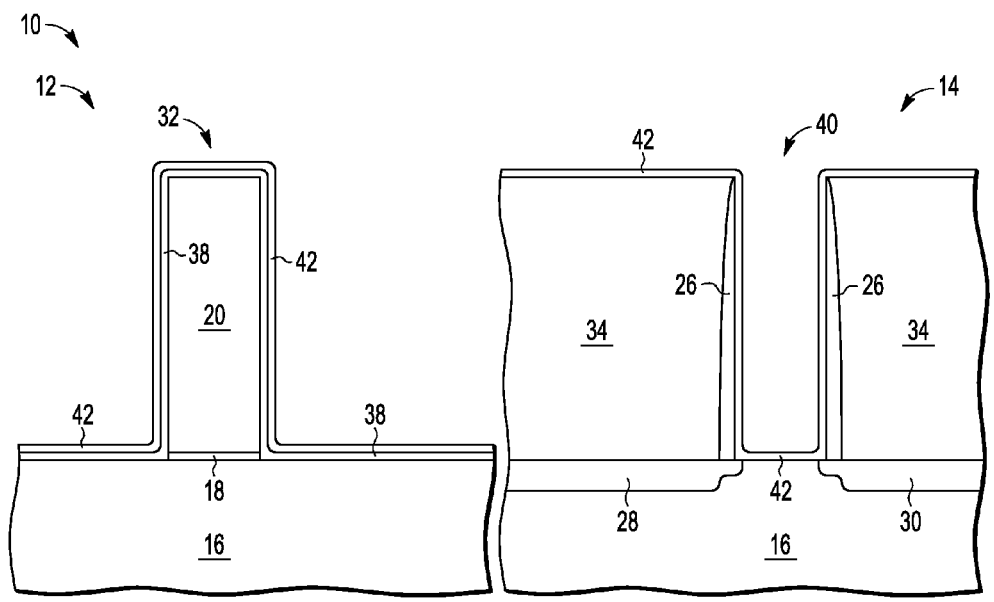
FIG. 10 is a cross section of a non-volatile memory cell and a replacement gate transistor of FIG. 9 at a subsequent stage in processing.

Shown in FIG. 10 is semiconductor device 10 after depositing a high-k dielectric 42 in opening 40 and on ILD 34 in logic portion 14 and on charge storage layer 38 in NVM portion 12. High-k dielectric 42 is on the sidewalls of opening 40 along sidewall spacer 26 and on the bottom of opening 40 on substrate 16.

Figure 11:
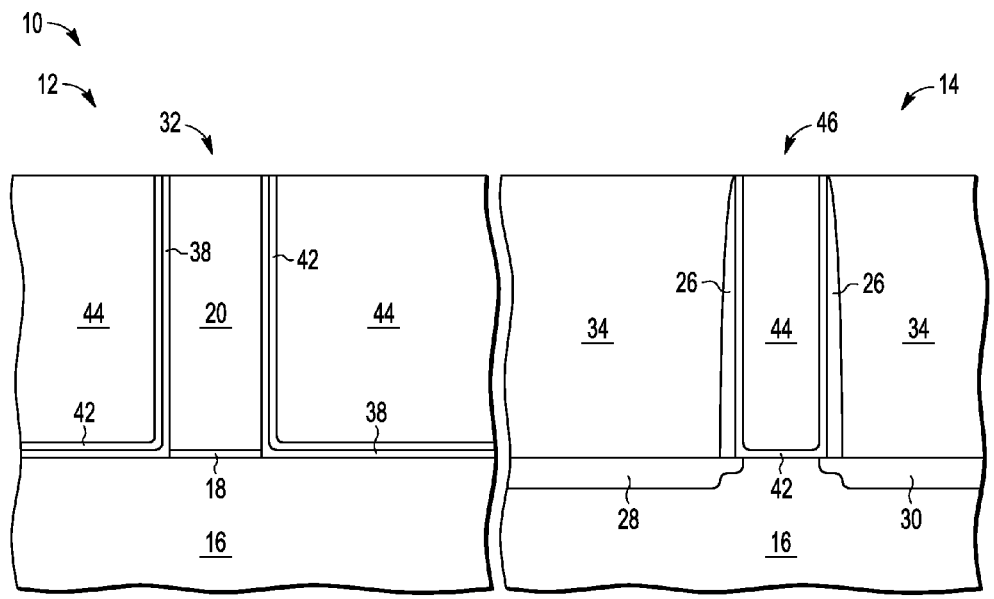
FIG. 11 is a cross section of a non-volatile memory cell and a replacement gate transistor of FIG. 10 at a subsequent stage in processing.

Shown in FIG. 11 is semiconductor device 10 after depositing a metal layer 44 and performing a step of chemical mechanical polishing. The result is that metal layer 44 in NVM portion 12 is on high-k dielectric 42, metal layer 44 has filled opening 40 to result in a logic gate 46, and logic gate 46 is the same height as metal layer 44 and select gate 32 in NVM portion 12. Being of the same height is a desirable result for ease of subsequent processing. Charge storage layer 38 and high-k dielectric layer 42 are no longer on the top surface of select gate 32. Logic portion 14 now has a logic transistor with a metal gate 46 and a high-k gate dielectric formed from high-k dielectric 42. Metal layer 44 may be a stack of metal layers. For example, a relatively thin metal layer may be directly on high-k dielectric layer 42 for setting the work function and a relatively thick metal layer may be on the relatively thin metal layer. Both the relatively thick and relatively thin metal layers may themselves be made up of more than one metal layer.

Figure 12:
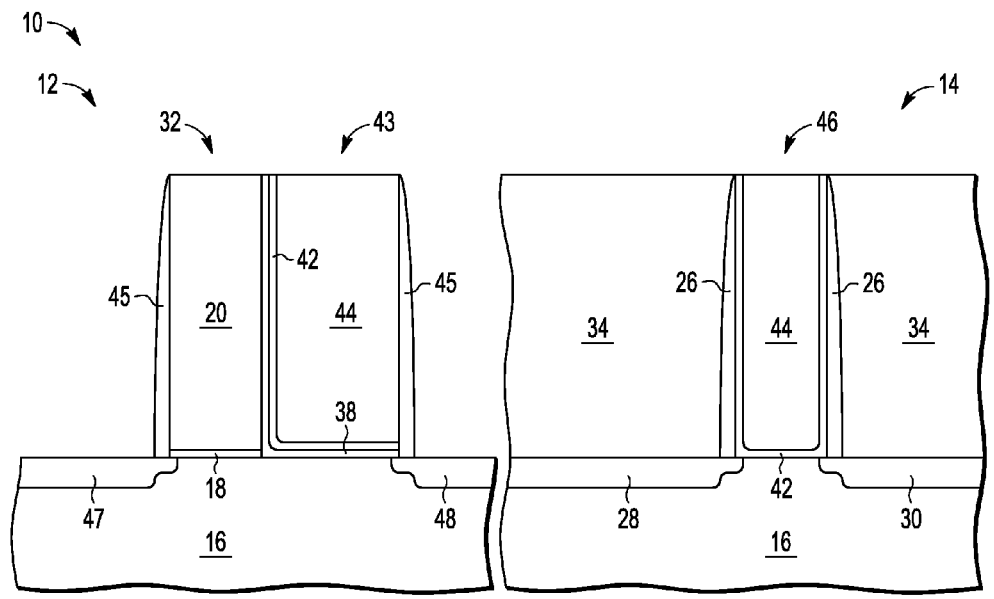
FIG. 12 is a cross section of a non-volatile memory cell and a replacement gate transistor of FIG. 11 at a subsequent stage in processing.
Figure 13:
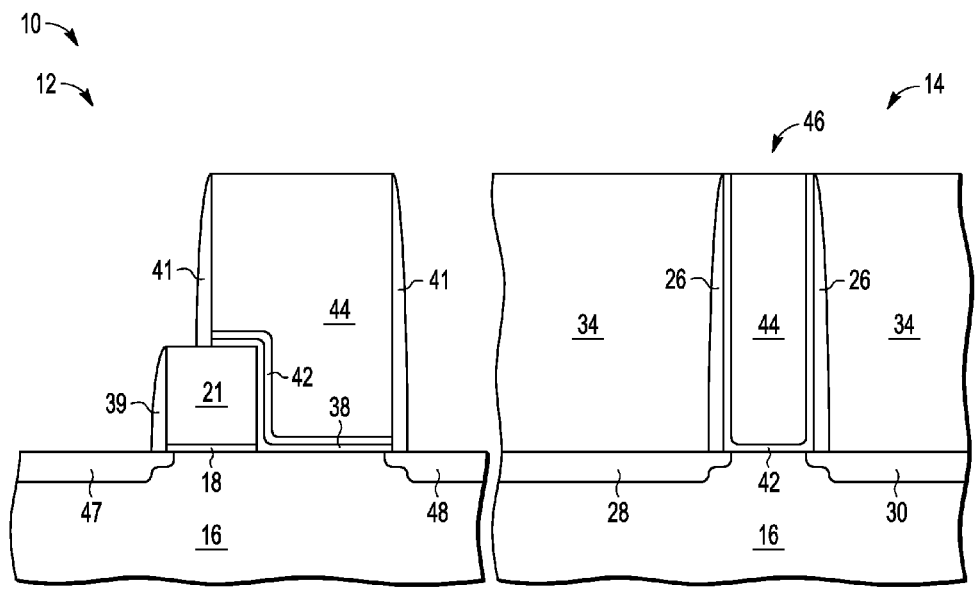
FIG. 13 is a cross section of a non-volatile memory cell and a replacement gate transistor after a continuation of the process after using the alternative of recessing the select gate shown in FIG. 6.

Shown in FIG. 12 is semiconductor device 10 after pattern-etching metal layer 44 in NVM portion 12 to result in a control gate 43 formed of the remaining portion of metal layer 44 in NVM portion 12. On the side of select gate 32 away from control gate 43, high-k dielectric layer 42 and charge storage layer 38 are removed. A source/drain region 47 is formed in substrate 16 adjacent to select gate 32, a source/drain region 48 is formed in substrate 16 adjacent to control gate 43, and a sidewall spacer 45 is formed around select gate 32 and control gate 43. An NVM cell is thus shown in NVM portion 12 of FIG. 12.

Shown in FIG. 13 is a completed NVM cell and logic transistor for the case where an etch-back of select gate 32, which was formed from polysilicon layer 20, occurs to line 36 shown in FIG. 6 to result in a select gate 21, and logic portion 14 remains the same as in FIG. 12. This etch-back reduces the height of the select gate so that the control gate formed of patterned metal layer 44 in NVM portion 12 shown in FIG. 13 extends over select gate 21. A sidewall spacer 41 surrounds this patterned portion of metal layer 44 in NVM portion 12 and a sidewall spacer 39 is on the side of select gate 21. Source/drain regions 47 and 48 are in this structure of FIG. 13 as they are for the structure shown in FIG. 12. The control gate could be thickened by use of an extra deposited metal layer on NVM portion 12 of FIG. 13.

Thus it is seen that an integration as described above and shown in FIGS. 1-13 can result in efficiently providing a high-k dielectric for the logic transistor and a metal replacement gate for the gate of a logic transistor and the control gate of an NVM memory cell.

Figure 14:
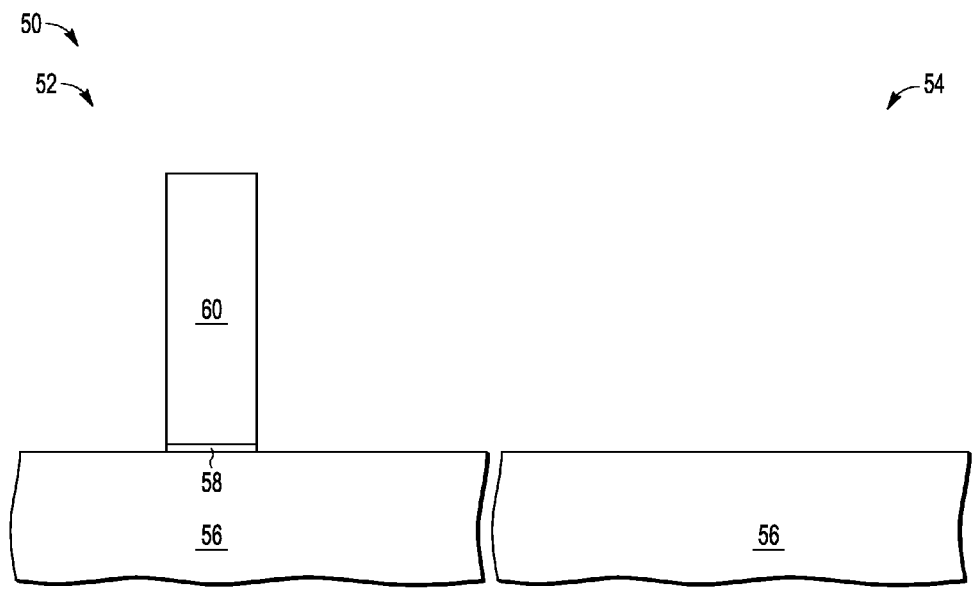
FIG. 14 is a cross section of a non-volatile memory cell and a replacement gate transistor at a stage in processing according to a second embodiment.

Shown in FIG. 14 is a semiconductor device 50 having a non-volatile memory (NVM) portion 52 and a logic portion 54 over a semiconductor substrate 56 of silicon. Over substrate 56 in NVM portion 52 is an oxide layer 58 formed by thermal oxidation and a polysilicon select gate 60 over oxide layer 58. Layers 58 and 60 are removed from logic portion 54 during this process of forming select gate 60 over oxide layer 58 in NVM portion 52.

Figure 15:
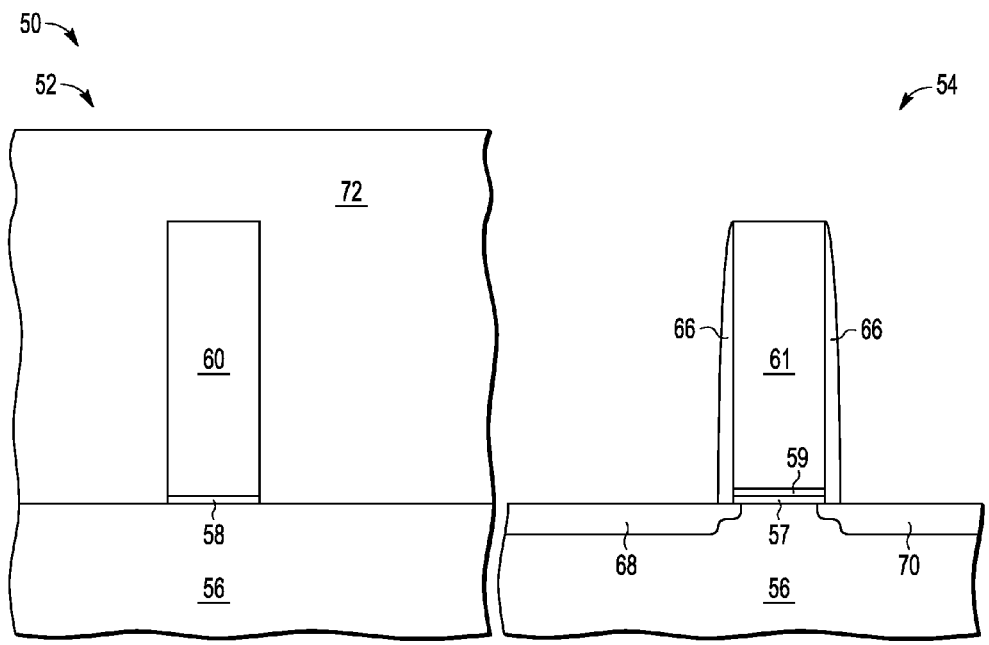
FIG. 15 is a cross section of the non-volatile memory cell and a replacement gate transistor of FIG. 14 at a subsequent stage in processing.

Shown in FIG. 15 is semiconductor device 50 after forming a partial replacement gate structure in logic portion 54 comprising a high-k gate dielectric 57, a work-function-setting layer 59 over high-k gate dielectric 57, and a dummy gate 61 surrounded by a sidewall spacer 66 and over work-function-setting layer 59. In substrate 56 are a source/drain region 68 adjacent to a first side of dummy gate 61 and a source/drain region 70 adjacent to a second side of dummy gate 61 opposite the first side. The structure in the logic region 54 as shown in FIG. 15 may be formed, while protecting NVM portion 52 with a protective layer 72, by depositing a high-k layer, depositing a work-function setting material on the high-k material; and depositing a dummy gate material on the work-function-setting material. This may be followed by patterning those three deposited materials to form dummy gate 61 aligned over work-function-setting material 59 and high-k dielectric 57. This may be a situation in which it is particularly advantageous for high-k dielectric 57 to be a dielectric stack which, in this case, would include a thermally grown oxide buffer layer. A source/drain implant is then performed followed by forming sidewall spacer 66. Another source/drain implant follows to leave the structure shown in FIG. 15. In an alternative embodiment, after the formation of the oxide layer that forms oxide layer 58 as shown in NVM portion 12 and the polysilicon layer that forms select gate 60, the partial replacement gate structure in logic region 54 is formed as shown in FIG. 15, prior to patterning the select gate in NVM region 52. Thus, the polysilicon layer acts as a protective layer and protective layer 72 may not be needed. Subsequent to the formation of the gate structure and the spacer and source/drains regions in logic region 54, the polysilicon layer and the oxide layer are patterned to form the select gate in NVM region 52.

Figure 16:
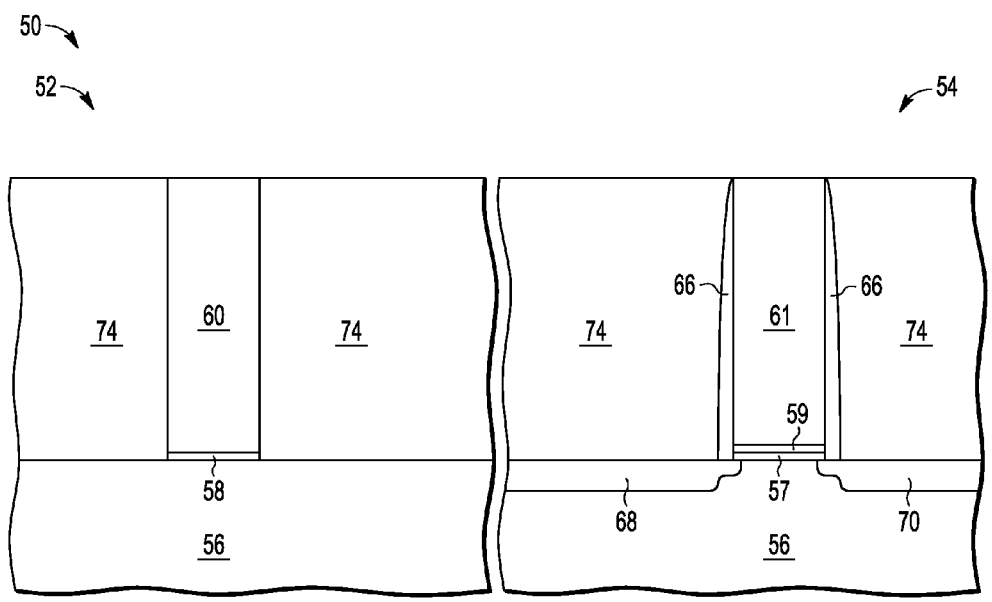
FIG. 16 is a cross section of the non-volatile memory cell and a replacement gate transistor of FIG. 15 at a subsequent stage in processing.

Shown in FIG. 16 is semiconductor device 50 after forming an interlayer dielectric (ILD) 74 on the sides of select gate 60 in NVM portion 52 and around sidewall spacer 66 and thus around dummy gate 61 in logic portion 54. ILD 74 has a top surface coplanar with a top surface of select gate 60 and a top surface of dummy gate 61. This may be achieved using the well-understood technique of deposition followed by chemical mechanical polishing.

Figure 17:
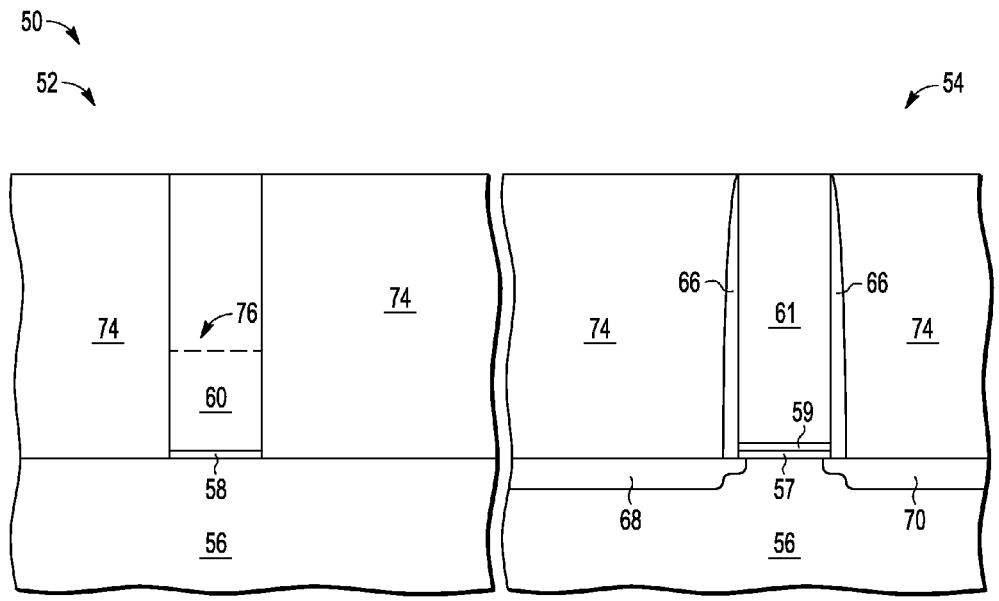
FIG. 17 is a cross section of the non-volatile memory cell and a replacement gate transistor of FIG. 16 at a subsequent stage in processing.

Shown in FIG. 17 is semiconductor device 50 with line 76 across select gate 60 where, as an alternative, an etch-back of select gate 60 may occur while logic portion 54 is protected. Polysilicon can be etched selectively to oxide so no mask is required on NVM portion 52 to achieve the etch-back of just select gate 60 in NVM portion 52 if that alternative is chosen. The etch-back would leave an alternate top surface at line 76 for the select gate in FIG. 17. As a further alternative approach for forming the select gate to top surface 76 as shown in FIG. 17, the deposition of select gate 60 in FIG. 14 could be replaced by an initial polysilicon deposition of the desired height followed by an etch stop layer and a fill material over the etch stop layer. The fill material could be polysilicon and the etch stop layer could be nitride. FIGS. 18-22 show subsequent processing with select gate 60 at its full height of FIG. 16 and FIG. 23 shows the result of etch-back processing applied instead to the select gate having its top surface at line 76.

Figure 18:
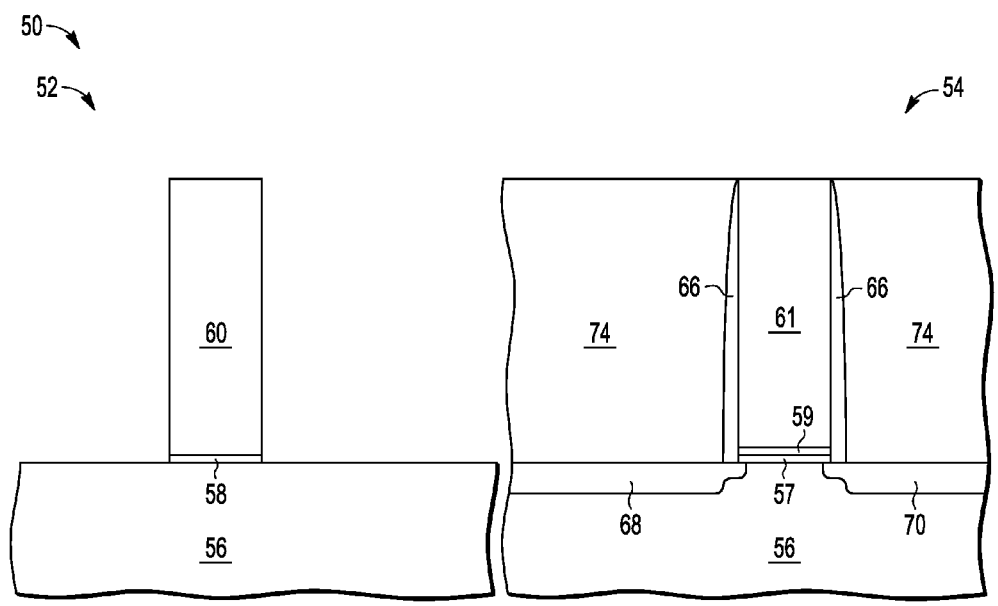
FIG. 18 is a cross section of the non-volatile memory cell and a replacement gate transistor of FIG. 17 at a subsequent stage in processing.

Shown in FIG. 18 is semiconductor device 50 after removing ILD 74 in NVM portion 52 showing select gate 60. This shows two sides of select gate 60 that run in the word line direction and are exposed. Logic portion 54 is masked and an etchant that removes oxide and that is selective to polysilicon is applied without requiring a mask over NVM portion 52. A mask may be required over logic region 54 to protect dummy gate 61.

Figure 19:
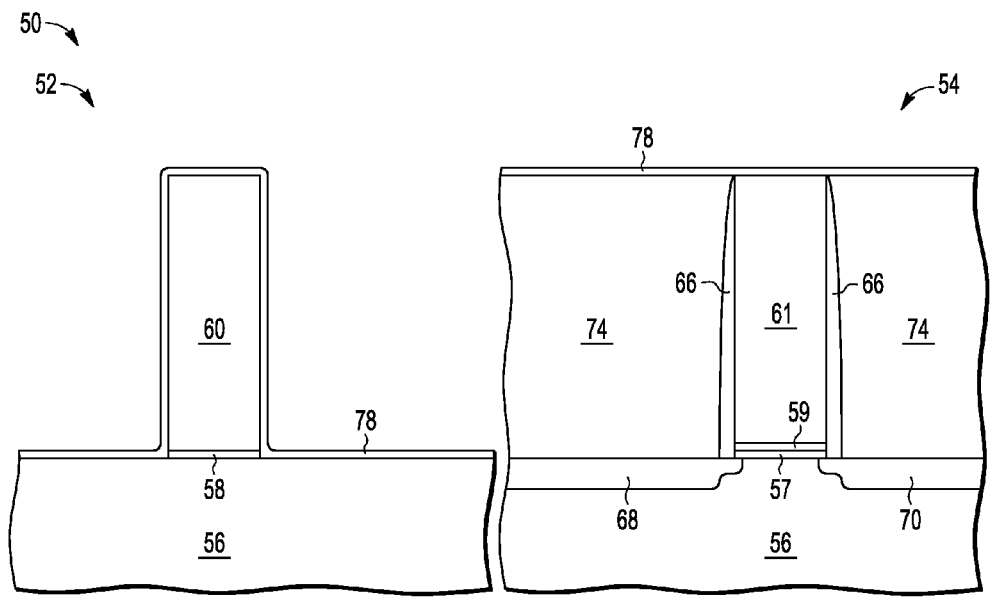
FIG. 19 is a cross section of the non-volatile memory cell and a replacement gate transistor of FIG. 18 at a subsequent stage in processing.

Shown in FIG. 19 is semiconductor device 50 after depositing a charge storage layer 78 on the top and two sides of select gate 60 of NVM portion 52 and on ILD 74 and dummy gate 61 of logic portion 54. Charge storage layer 78 may comprise a dielectric layer on substrate 56, nanocrystals on the dielectric layer, and a fill dielectric that is a height above the nanocrystals. The nanocrystals may, for example, be metal or polysilicon. Charge storage layer 78 may also comprise an oxide/nitride/oxide (ONO) stack. Charge storage layer 78 also may include a top barrier/conductive layer so that the fill dielectric does not get directly exposed during subsequent processing.

Figure 20:
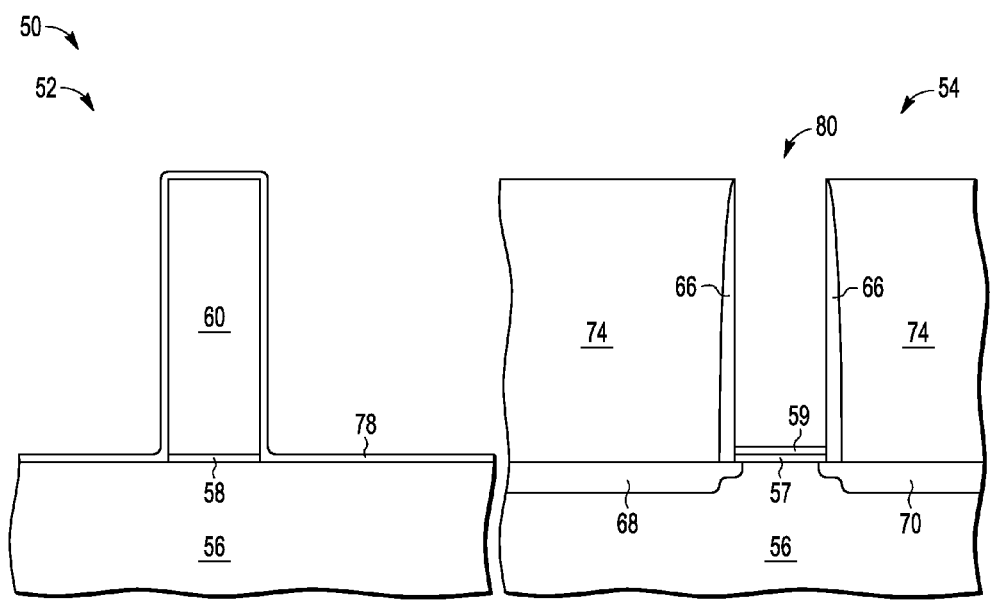
FIG. 20 is a cross section of the non-volatile memory cell and a replacement gate transistor of FIG. 19 at a subsequent stage in processing.

Shown in FIG. 20 is semiconductor device 50 after removing dummy gate 61 to leave an opening 80 in logic portion 54 surrounded by sidewall spacer 66. Charge storage layer 78 is also removed in logic portion 54. NVM portion 52 is masked during this removal of dummy gate 61. No mask is required on logic portion 54 because an etchant that etches dummy gate 61 can be found that is selective to ILD 74.

Figure 21:
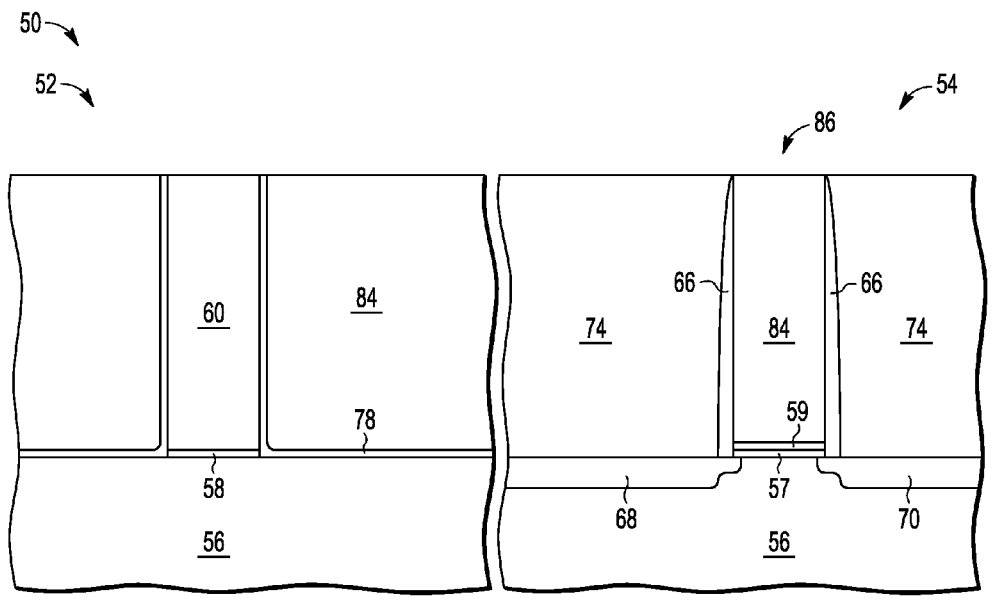
FIG. 21 is a cross section of the non-volatile memory cell and a replacement gate transistor of FIG. 20 at a subsequent stage in processing.

Shown in FIG. 21 is semiconductor device 50 after depositing a metal layer 84 and performing a step of chemical mechanical polishing. The result is that metal layer 84 in NVM portion 52 is on charge storage layer 78, metal layer 84 has filled opening 80 to result in a logic gate 86 that combines metal from metal layer 84 and work-function-setting material 59. Logic gate 86 is the same height as metal layer 84 and select gate 60 in NVM portion 52. Being of the same height is a desirable result for ease of subsequent processing. Charge storage layer 78 is no longer on the top surface of select gate 60. Logic portion 54 now has a logic transistor with a gate that has a significant thickness of metal for high conductivity formed relatively late in the process of transistor formation, a work-function-setting material formed early in the process but after forming an oxide layer using thermal oxidation, and a high-k gate dielectric also formed early in the process but also formed after forming the oxide layer using thermal oxidation.

Figure 22:
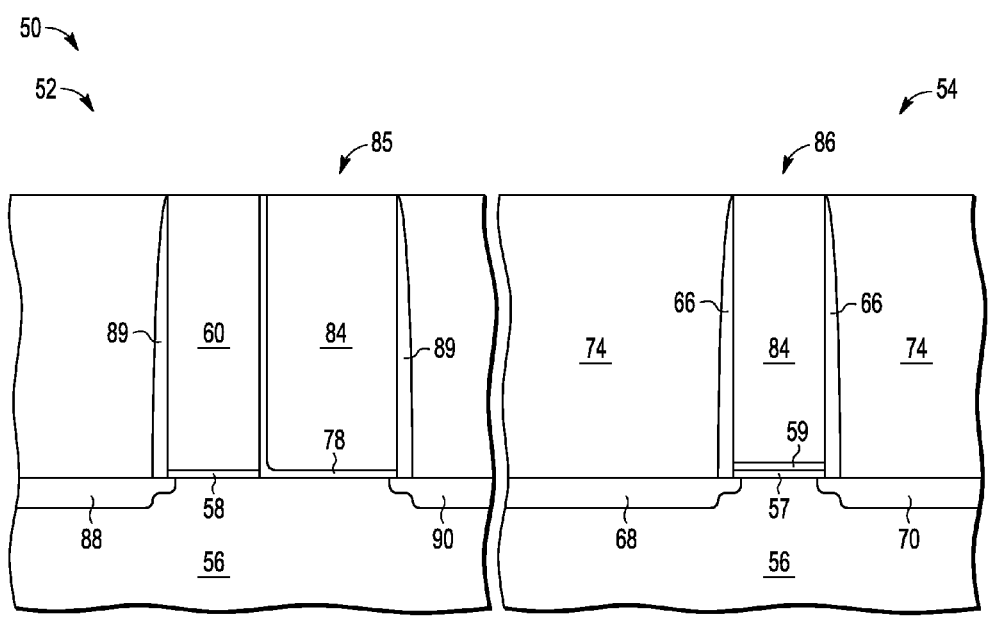
FIG. 22 is a cross section of the non-volatile memory cell and a replacement gate transistor of FIG. 21 at a subsequent stage in processing.
Figure 23:
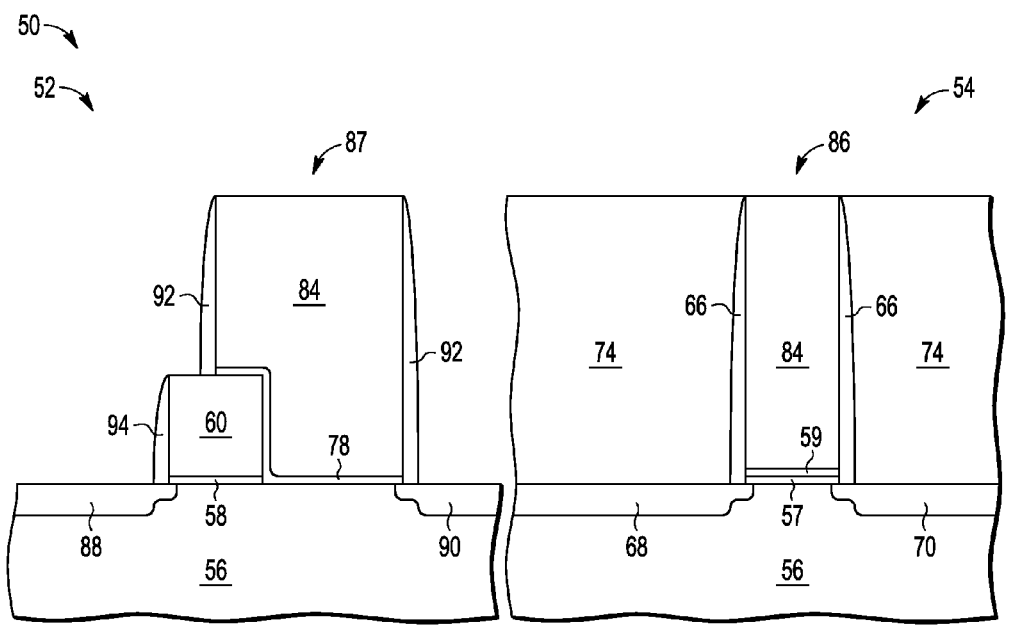
FIG. 23 is a cross section of the non-volatile memory cell and a replacement gate transistor after a continuation of the process after using the alternative of recessing the select gate shown in FIG. 17.

Shown in FIG. 22 is semiconductor device 50 after pattern etching metal layer 84 in NVM portion 52 to result in a control gate 85 formed of the remaining portion of metal layer 84 in NVM portion 52. On the side of select gate 60 away from control gate 85, charge storage layer 78 is removed. A source/drain region 88 is formed in substrate 56 adjacent to select gate 60, a source/drain region 90 is formed in substrate 56 adjacent to control gate 85, and a sidewall spacer 89 is formed around select gate 60 and control gate 85. An NVM cell is thus shown in NVM portion 52 of FIG. 22. The top surfaces of select gate 60, control gate 85, and logic gate 86 are coplanar.

Shown in FIG. 23 is a completed NVM cell and logic transistor for the case where an etch-back of select gate 60 occurs to line 76 as shown in FIG. 17. This reduces the height of the select gate so that a control gate 87 formed of patterned metal layer 84 shown in FIG. 23 extends over the select gate. A sidewall spacer 92 surrounds control gate 87 and a sidewall spacer 94 is on the side of the select gate. Source/drain regions 88 and 90 are in this structure as they are for the structure of FIG. 22. The control gate can be thickened by an additional metal deposition on the control gate to increase its conductivity. This could be done on NVM portion 52 in FIG. 23.

Thus it is seen that an integration as described above and shown in FIGS. 14-23 can result in efficiently providing a high-k dielectric for the logic transistor and a metal replacement gate for the gate of a logic transistor and the control gate of an NVM memory cell in a partial replacement gate process.

By now it should be appreciated that there has been described a method for forming a semiconductor device having a non-volatile memory (NVM) region and a logic region. The method includes forming a thermally grown oxygen-containing layer over a semiconductor layer in the NVM region and the logic region. The method further includes forming a polysilicon layer over the thermally grown oxygen-containing layer. The method further includes patterning the polysilicon layer and thermally grown oxygen-containing layer in the logic region to form a dummy gate and dummy gate dielectric in the logic region. The method further includes patterning the polysilicon layer and thermally grown oxygen-containing layer to form a select gate and a gate dielectric in the NVM region. The method further includes forming a first dielectric layer over the semiconductor layer in the NVM region and the logic region, wherein the first dielectric layer surrounds the select gate and gate dielectric in the NVM region and surrounds the dummy gate and dummy gate dielectric in the logic region. The method further includes removing the first dielectric layer from the NVM region while protecting the first dielectric layer in the logic region. The method further includes forming a charge storage layer over the semiconductor layer and select gate in the NVM region, and over the first dielectric layer and the dummy gate in the logic region. The method further includes removing the charge storage layer from the logic region. The method further includes removing the dummy gate and dummy gate dielectric in the logic region which results in an opening in the logic region. The method further includes forming a second dielectric layer over the charge storage layer in the NVM region and over the first dielectric layer and within the opening in the logic region. The method further includes forming a gate layer over the second dielectric layer in the NVM region and over the second dielectric layer and in the opening in the logic region. The method further includes removing a top portion of the gate layer in the NVM region and the logic region, wherein a remaining portion of the gate layer in the opening forms a logic gate in the logic region. The method further includes patterning a remaining portion of the gate layer in the NVM region to form a control gate in the NVM region that is laterally adjacent the select gate, wherein a top surface of the control gate is substantially coplanar with a top surface of the logic gate. The method may have a further characterization by which the step of patterning the remaining portion of the gate layer in the NVM region is further characterized in that a top surface of the select gate is substantially coplanar with the top surface of the control gate. The method may have a further characterization by which the step of forming the first dielectric layer is performed such that a top surface of the first dielectric layer is substantially coplanar with top surfaces of the select gate and the dummy gate. The method may have a further characterization by which after the step of forming the first dielectric layer and prior to the step of forming the charge storage layer, removing a top portion of the select gate such that the top surface of the select gate is recessed from the top surface of the first dielectric layer. The method may have a further characterization by which the step of patterning the remaining portion of the gate layer in the NVM region is further characterized in that the control gate is laterally adjacent the select gate and overlaps one sidewall of the select gate. The method may have a further characterization by which the step of forming the first dielectric layer includes forming the first dielectric layer over the semiconductor layer, the select gate, and the dummy gate and planarizing the first dielectric layer to expose the select gate and the dummy gate. The method may have a further characterization by which the step of forming the second dielectric layer is performed such that the second dielectric layer is in contact with the semiconductor layer within the opening in the logic region. The method may have a further characterization by which the second dielectric layer comprises a dielectric material having a high dielectric constant. The method may have a further characterization by which the step of forming the charge storage layer includes forming a third dielectric layer, forming nanocrystals on the third dielectric layer and forming a fill dielectric over the nanocrystals such that the fill dielectric extends above the nanocrystals. The method may have a further characterization by which the second dielectric layer is further characterized as a portion of the charge storage layer. The method may have a further characterization by which the step of forming the charge storage layer includes forming a third dielectric layer, forming a silicon nitride storage layer over the third dielectric layer, and forming a fill dielectric over the silicon nitride storage layer. The method may have a further characterization by which the gate layer comprises a metal. The method may further include forming a sidewall spacer adjacent a sidewall of the dummy gate and forming source/drain regions in the semiconductor layer adjacent the dummy gate.

Also described is a method for forming a semiconductor device having a non-volatile memory (NVM) region and a logic region. The method includes forming a thermally grown oxygen-containing layer over a semiconductor layer in the NVM region and the logic region. The method further includes forming a polysilicon layer over the thermally grown oxygen-containing layer. The method further includes patterning the polysilicon layer and the thermally grown oxygen-containing layer in the logic region to form a dummy gate and dummy gate dielectric in the logic region. The method further includes patterning the polysilicon layer and thermally grown oxygen-containing layer to form a select gate and a gate dielectric in the NVM region. The method further includes forming a first dielectric layer over the semiconductor layer in the NVM region and the logic region, wherein the first dielectric layer surrounds the select gate and gate dielectric in the NVM region and surrounds the dummy gate and dummy gate dielectric in the logic region, and wherein a top surface of the first dielectric layer is substantially coplanar with top surfaces of the select gate and the dummy gate. The method further includes removing a portion of the select gate such that the top surface of the select gate is recessed from the top surface of the first dielectric layer. The method further includes after the step of removing the portion of the select gate, removing the first dielectric layer from the NVM region while protecting the first dielectric layer in the logic region. The method further includes forming a charge storage layer over the semiconductor layer and the select gate in the NVM region, and over the first dielectric layer and the dummy gate in the logic region. The method further includes removing the charge storage layer from the logic region. The method further includes removing the dummy gate and dummy gate dielectric in the logic region which results in an opening in the logic region. The method further includes forming a second dielectric layer over the charge storage layer in the NVM region and over the first dielectric layer and within the opening in the logic region. The method further includes forming a gate layer over the second dielectric layer in the NVM region and over the second dielectric layer and in the opening in the logic region. The method further includes removing a top portion of the gate layer in the NVM region and the logic region, wherein a remaining portion of the gate layer in the opening forms a logic gate in the logic region. The method further includes patterning a remaining portion of the gate layer in the NVM region to form a control gate in the NVM region that is laterally adjacent the select gate and overlaps one sidewall of the select gate. The method may have a further characterization by which the second dielectric layer comprises a dielectric material having a high dielectric constant. The method may have a further characterization by which the gate layer comprises a metal. The method may have a further characterization by which the charge storage layer comprises one of nanocrystals or silicon nitride.

Described also is a method for forming a semiconductor device having a non-volatile memory (NVM) region and a logic region. The method includes forming a thermally grown oxygen-containing layer over a semiconductor layer in the NVM region and the logic region. The method further includes forming a polysilicon layer over the thermally grown oxygen-containing layer. The method further includes patterning the polysilicon layer and thermally grown oxygen-containing layer in the logic region to form a dummy gate and dummy gate dielectric in the logic region. The method further includes patterning the polysilicon layer and thermally grown oxygen-containing layer to form a select gate and a gate dielectric in the NVM region. The method further includes forming a first dielectric layer over the semiconductor layer, the select gate, and the dummy gate. The method further includes planarizing the first dielectric layer to expose the select gate and the dummy gate. The method further includes removing the first dielectric layer from the NVM region while protecting the first dielectric layer in the logic region. The method further includes forming a charge storage layer over the semiconductor layer and select gate in the NVM region, and over the first dielectric layer and the dummy gate in the logic region. The method further includes removing the charge storage layer from the logic region. The method further includes removing the dummy gate and dummy gate dielectric in the logic region which results in an opening in the logic region. The method further includes forming a second dielectric layer over the charge storage layer in the NVM region and over the first dielectric layer and within the opening in the logic region, wherein the second dielectric layer comprises a dielectric material having a high dielectric constant. The method further includes forming a metal-containing gate layer over the second dielectric layer in the NVM region and over the second dielectric layer and in the opening in the logic region. The method further includes planarizing the metal-containing gate layer in the NVM region and the logic region to expose the first dielectric layer in the logic region, wherein a remaining portion of the metal-containing gate layer in the opening forms a logic gate in the logic region. The method further includes after planarizing the metal-containing gate layer, patterning the metal-containing gate layer in the NVM region to form a control gate in the NVM region that is laterally adjacent the select gate, wherein a top surface of the control gate is substantially coplanar with a top surface of the logic gate. The method may have a further characterization by which the step of patterning the metal-containing gate layer in the NVM region is further characterized in that a top surface of the select gate is substantially coplanar with the top surface of the control gate. The method may further include after the step of forming the first dielectric layer and prior to the step of forming the charge storage layer, removing a top portion of the select gate such that the top surface of the select gate is recessed from the top surface of the first dielectric layer, wherein the step of patterning the remaining portion of the gate layer in the NVM region is further characterized in that the control gate is laterally adjacent the select gate and overlaps one sidewall of the select gate.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a layer that is shown as a single layer may be composite of layers. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device having a non-volatile memory (NVM) region and a logic region, the method comprising:
    forming a thermally grown oxygen-containing layer over a semiconductor layer in the NVM region and the logic region;
    forming a polysilicon layer over the thermally grown oxygen-containing layer;
    patterning the polysilicon layer and thermally grown oxygen-containing layer in the logic region to form a dummy gate and dummy gate dielectric in the logic region;
    patterning the polysilicon layer and thermally grown oxygen-containing layer to form a select gate and a gate dielectric in the NVM region;
    forming a first dielectric layer over the semiconductor layer in the NVM region and the logic region, wherein the first dielectric layer surrounds the select gate and gate dielectric in the NVM region and surrounds the dummy gate and dummy gate dielectric in the logic region;
    removing the first dielectric layer from the NVM region while protecting the first dielectric layer in the logic region;
    forming a charge storage layer over the semiconductor layer and select gate in the NVM region, and over the first dielectric layer and the dummy gate in the logic region;
    removing the charge storage layer from the logic region;
    removing the dummy gate and dummy gate dielectric in the logic region which results in an opening in the logic region;
    forming a second dielectric layer over the charge storage layer in the NVM region and over the first dielectric layer and within the opening in the logic region;
    forming a gate layer over the second dielectric layer in the NVM region and over the second dielectric layer and in the opening in the logic region;
    removing a top portion of the gate layer in the NVM region and the logic region, wherein a remaining portion of the gate layer in the opening forms a logic gate in the logic region; and
    patterning a remaining portion of the gate layer in the NVM region to form a control gate in the NVM region that is laterally adjacent the select gate, wherein a top surface of the control gate is substantially coplanar with a top surface of the logic gate.

2. The method of claim 1, wherein the step of patterning the remaining portion of the gate layer in the NVM region is further characterized in that a top surface of the select gate is substantially coplanar with the top surface of the control gate.

3. The method of claim 1, wherein the step of forming the first dielectric layer is performed such that a top surface of the first dielectric layer is substantially coplanar with top surfaces of the select gate and the dummy gate.

4. The method of claim 3, further comprising:
    after the step of forming the first dielectric layer and prior to the step of forming the charge storage layer, removing a top portion of the select gate such that the top surface of the select gate is recessed from the top surface of the first dielectric layer.

5. The method of claim 4, wherein the step of patterning the remaining portion of the gate layer in the NVM region is further characterized in that the control gate is laterally adjacent the select gate and overlaps one sidewall of the select gate.

6. The method of claim 3, wherein the step of forming the first dielectric layer comprises:
    forming the first dielectric layer over the semiconductor layer, the select gate, and the dummy gate; and
    planarizing the first dielectric layer to expose the select gate and the dummy gate.

7. The method of claim 1, wherein the step of forming the second dielectric layer is performed such that the second dielectric layer is in contact with the semiconductor layer within the opening in the logic region.

8. The method of claim 1, wherein the second dielectric layer comprises a dielectric material having a high dielectric constant.

9. The method of claim 8, wherein the step of forming the charge storage layer comprises:
    forming a third dielectric layer;
    forming nanocrystals on the third dielectric layer; and
    forming a fill dielectric over the nanocrystals such that the fill dielectric extends above the nanocrystals.

10. The method of claim 9, wherein the second dielectric layer is further characterized as a portion of the charge storage layer.

11. The method of claim 8, wherein the step of forming the charge storage layer comprises:
    forming a third dielectric layer;
    forming a silicon nitride storage layer over the third dielectric layer; and
    forming a fill dielectric over the silicon nitride storage layer.

12. The method of claim 8, wherein the gate layer comprises a metal.

13. The method of claim 1, further comprising:
    forming a sidewall spacer adjacent a sidewall of the dummy gate; and
    forming source/drain regions in the semiconductor layer adjacent the dummy gate.

14. A method for forming a semiconductor device having a non-volatile memory (NVM) region and a logic region, the method comprising:
    forming a thermally grown oxygen-containing layer over a semiconductor layer in the NVM region and the logic region;
    forming a polysilicon layer over the thermally grown oxygen-containing layer;
    patterning the polysilicon layer and the thermally grown oxygen-containing layer in the logic region to form a dummy gate and dummy gate dielectric in the logic region;
    patterning the polysilicon layer and thermally grown oxygen-containing layer to form a select gate and a gate dielectric in the NVM region;
    forming a first dielectric layer over the semiconductor layer in the NVM region and the logic region, wherein the first dielectric layer surrounds the select gate and gate dielectric in the NVM region and surrounds the dummy gate and dummy gate dielectric in the logic region, and wherein a top surface of the first dielectric layer is substantially coplanar with top surfaces of the select gate and the dummy gate;

removing a portion of the select gate such that the top surface of the select gate is recessed from the top surface of the first dielectric layer;

after the step of removing the portion of the select gate, removing the first dielectric layer from the NVM region while protecting the first dielectric layer in the logic region;

forming a charge storage layer over the semiconductor layer and the select gate in the NVM region, and over the first dielectric layer and the dummy gate in the logic region;

removing the charge storage layer from the logic region;

removing the dummy gate and dummy gate dielectric in the logic region which results in an opening in the logic region;

forming a second dielectric layer over the charge storage layer in the NVM region and over the first dielectric layer and within the opening in the logic region;

forming a gate layer over the second dielectric layer in the NVM region and over the second dielectric layer and in the opening in the logic region;

removing a top portion of the gate layer in the NVM region and the logic region, wherein a remaining portion of the gate layer in the opening forms a logic gate in the logic region; and patterning a remaining portion of the gate layer in the NVM region to form a control gate in the NVM region that is laterally adjacent the select gate and overlaps one sidewall of the select gate.

15. The method of claim 14, wherein the second dielectric layer comprises a dielectric material having a high dielectric constant.

16. The method of claim 14, wherein the gate layer comprises a metal.

17. The method of claim 14, wherein the charge storage layer comprises one of nanocrystals or silicon nitride.

18. A method for forming a semiconductor device having a non-volatile memory (NVM) region and a logic region, the method comprising:

forming a thermally grown oxygen-containing layer over a semiconductor layer in the NVM region and the logic region;

forming a polysilicon layer over the thermally grown oxygen-containing layer;

patterning the polysilicon layer and thermally grown oxygen-containing layer in the logic region to form a dummy gate and dummy gate dielectric in the logic region;

patterning the polysilicon layer and thermally grown oxygen-containing layer to form a select gate and a gate dielectric in the NVM region;

forming a first dielectric layer over the semiconductor layer, the select gate, and the dummy gate;

planarizing the first dielectric layer to expose the select gate and the dummy gate;

removing the first dielectric layer from the NVM region while protecting the first dielectric layer in the logic region;

forming a charge storage layer over the semiconductor layer and select gate in the NVM region, and over the first dielectric layer and the dummy gate in the logic region;

removing the charge storage layer from the logic region;

removing the dummy gate and dummy gate dielectric in the logic region which results in an opening in the logic region;

forming a second dielectric layer over the charge storage layer in the NVM region and over the first dielectric layer and within the opening in the logic region, wherein the second dielectric layer comprises a dielectric material having a high dielectric constant;

forming a metal-containing gate layer over the second dielectric layer in the NVM region and over the second dielectric layer and in the opening in the logic region;

planarizing the metal-containing gate layer in the NVM region and the logic region to expose the first dielectric layer in the logic region, wherein a remaining portion of the metal-containing gate layer in the opening forms a logic gate in the logic region; and after planarizing the metal-containing gate layer, patterning the metal-containing gate layer in the NVM region to form a control gate in the NVM region that is laterally adjacent the select gate, wherein a top surface of the control gate is substantially coplanar with a top surface of the logic gate.

19. The method of claim 18, wherein the step of patterning the metal-containing gate layer in the NVM region is further characterized in that a top surface of the select gate is substantially coplanar with the top surface of the control gate.

20. The method of claim 18, further comprising:

after the step of forming the first dielectric layer and prior to the step of forming the charge storage layer, removing a top portion of the select gate such that the top surface of the select gate is recessed from the top surface of the first dielectric layer, wherein the step of patterning the remaining portion of the gate layer in the NVM region is further characterized in that the control gate is laterally adjacent the select gate and overlaps one sidewall of the select gate.

* * * * *